(12) United States Patent
Kwak et al.

(10) Patent No.: US 6,442,103 B1
(45) Date of Patent: Aug. 27, 2002

(54) SYNCHRONOUS SRAM DEVICE WITH LATE WRITE FUNCTION

(75) Inventors: Jong-Tack Kwak; Jin-Ho Kwack; Sun-Min Lee; Jin-Sung Kim, all of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/963,962

(22) Filed: Sep. 26, 2001

(30) Foreign Application Priority Data

Mar. 23, 2001 (KR) ............................................. 01-15143

(51) Int. Cl.$^7$ ................................................. G11C 8/00
(52) U.S. Cl. ................... 365/233; 365/189.05; 365/154
(58) Field of Search ........................... 365/233, 189.05, 365/230.08, 154

(56) References Cited

U.S. PATENT DOCUMENTS 6,134,180 A     10/2000  Kim et al. .................... 365/233
6,337,809 B1 *  1/2002   Kim et al. .................... 365/233

* cited by examiner

Primary Examiner—Huan Hoang
(74) Attorney, Agent, or Firm—Mills & Onello, LLP

(57) ABSTRACT

A synchronous memory device includes a late write mode of operation, and includes a memory cell array storing data information. The synchronous memory device comprises a write-in command detector, a data input control signal generator, first and second latch circuits, and a multiplexer. The write-in command detector generates a first flag signal indicating that write-in command is applied to the memory device, and generates a second flag signal indicating that the write-in command is received during successive clock cycles. The data input control signal generator, in response to the first flag signal, sequentially generates data input control signals synchronized with a clock signal. The first latch circuit sequentially latches write-in data from external sources in response to the data input control signals, and the second latch circuit latches data latched in the first latch circuit in response to at least one of the data input control signals. The multiplexer selects one of the first and second latch circuits in response to the second flag signal. The selected outputs of the latch circuits are stored to a memory cell array through the write-in circuit within sufficient setup time parameters.

6 Claims, 7 Drawing Sheets

SYNCHRONOUS SRAM DEVICE WITH LATE WRITE FUNCTION

This application relies for priority upon Korean Patent Application No. 2001-15143, filed on Mar. 23, 2001, the contents of which are herein incorporated by reference in their entirety.

FIELD OF THE INVENTION

The present invention relates to the field of semiconductor devices, and more particularly to a synchronous SRAM (Static Random-Access Memory) device having a late write mode.

BACKGROUND OF THE INVENTION

In a semiconductor memory device with double data rate (to be referred to as "DDR" hereinafter) mode, for example, in case of a SRAM, burst type data is transferred (or input/output) in accordance with the rising and falling edges of a signal, for example a system clock. For example, four data input during a write-in operation are stored in a temporary register, and the four data stored therein are written into memory cells following the input of the next write-in command. When data is read during the following cycle, stored data is output from the temporary register so as to output immediately the input data. As well known in this art, when data is written, a DDR SRAM device with "late write mode" capability receives four data successively in accordance with the clock signal of the next cycle, following a write-in command.

It is assumed that the time period for inputting data in the SRAM device is artificially delayed by one-half cycle of clock signal. Since data input for the SRAM device can be completed in one-half cycle, the central processing unit (CPU) can perform other operations during the half cycle of clock signal. Here, since the time period for inputting data is artificially delayed by the half cycle of clock signal, the time period for writing data in a memory cell of SRAM device is also delayed by a half cycle of clock signal. Therefore, it is impossible during this time period to write-in data in memory cells of the SRAM device.

Even though the time period for inputting data is delayed by a half cycle on the basis of the clock signal in order to obtain suitable operation margin for the CPU (or data is input after 1½ cycles), it needs to be obtained enough write-in time into a memory cell.

SUMMARY OF THE INVENTION

The object of the present invention is to provide a SRAM device having late write mode capable of obtaining enough time for writing into a memory cell even though data input is delayed.

According to the present invention, the synchronous memory device of the present invention includes a late write mode of operation, and includes a memory cell array storing data information. A write-in command detector generates a first flag signal indicating receipt of a write-in command when the write-in command is applied to said memory device, detects whether said write-in command is received during successive clock cycles, and generates a second flag signal indicating the receipt of successive write-in commands during successive clock cycles. A data input control signal generator sequentially generates multiple data input control signals synchronized with the clock cycles in response to said first flag signal, the data input control signals being generated following the receipt of said write-in command and thereafter following 1½ clock cycles.

In a preferred embodiment, the synchronous memory device further comprises a first latch circuit for sequentially latching write-in data from external sources in response to said data input control signals; a second latch circuit for latching data latched in said first latch circuit in response to at least one of the data input control signals; and a select circuit for selecting one of said first and second latch circuits in response to said second flag signal.

The data input control signals are preferably sequentially activated during one-half cycle of said clock cycle. The first latch circuit may include first, second, third and fourth flip-flops which are separately controlled by said data input control signals, and the second latch circuit may include fifth, sixth, seventh and eighth flip-flops, wherein said fifth and sixth flip-flops latch outputs of the first and second flip-flops in response to a second data input control signal, respectively, and wherein the seventh and eighth flip-flops latch outputs of the third and fourth flip-flops in response to a fourth data input control signal.

The select circuit preferably selects the first latch circuit when the second flag signal indicates that said write-in command is successively received, and selects the second latch circuit when the second flag signal indicates that another command is received following a write-in command.

BRIEF DESCRIPTION OF THE DRAWINGS

The present invention will be more clearly understood from the following description with reference to the accompanying drawings, wherein.

DETAILED DESCRIPTION OF PREFERRED EMBODIMENTS

Referring to FIGS. 1 to 6, a preferred embodiment of the present invention will be described below.

The SRAM device of the present invention is preferably capable of operation in double data rate (DDR) and single data rate (SDR) modes. While the SDR mode performs a read or write operation at the time of the rising edge of a clock signal, the DDR mode performs a read or write operation at the rising or falling edges of a clock signal. The SRAM device also includes a late write mode. In the late write mode of SRAM device, write-in data is provided to a data input register following 1½ clock cycles, rather than 1 cycle, when address and control signals are given. The write-in data is provided after 1½ clock cycle when write-in command is input, and thereby, the CPU can perform other operations during the remaining half cycle of clock signal. Even though data is input after a half cycle of clock signal in comparison with the conventional SRAM device, the SRAM device of the present invention has a data input register and a control circuit capable of obtaining enough time to set up data to be written into a memory cell, and it will be described below in detail.

Further, the SRAM device of the present invention provides a bypass read-out operation mode. Because write-in data is not fully written into the array during the first write cycle, it is necessary to monitor states of address in case that next read-out operation is performed in an unwritten area. For this reason, an address comparator confirms whether a new read address is the same as an address latched into the write address register. If it is the same, read data is then provided from write-in data stored in the data input register. The synchronous burst memory device with DDR and SDR operation modes and bypass read-out operation mode are proposed in U.S. Pat. No. 6,134,180 "Synchronous Burst Semiconductor Memory Device", the contents being incorporated herein by reference.

Figure 1:
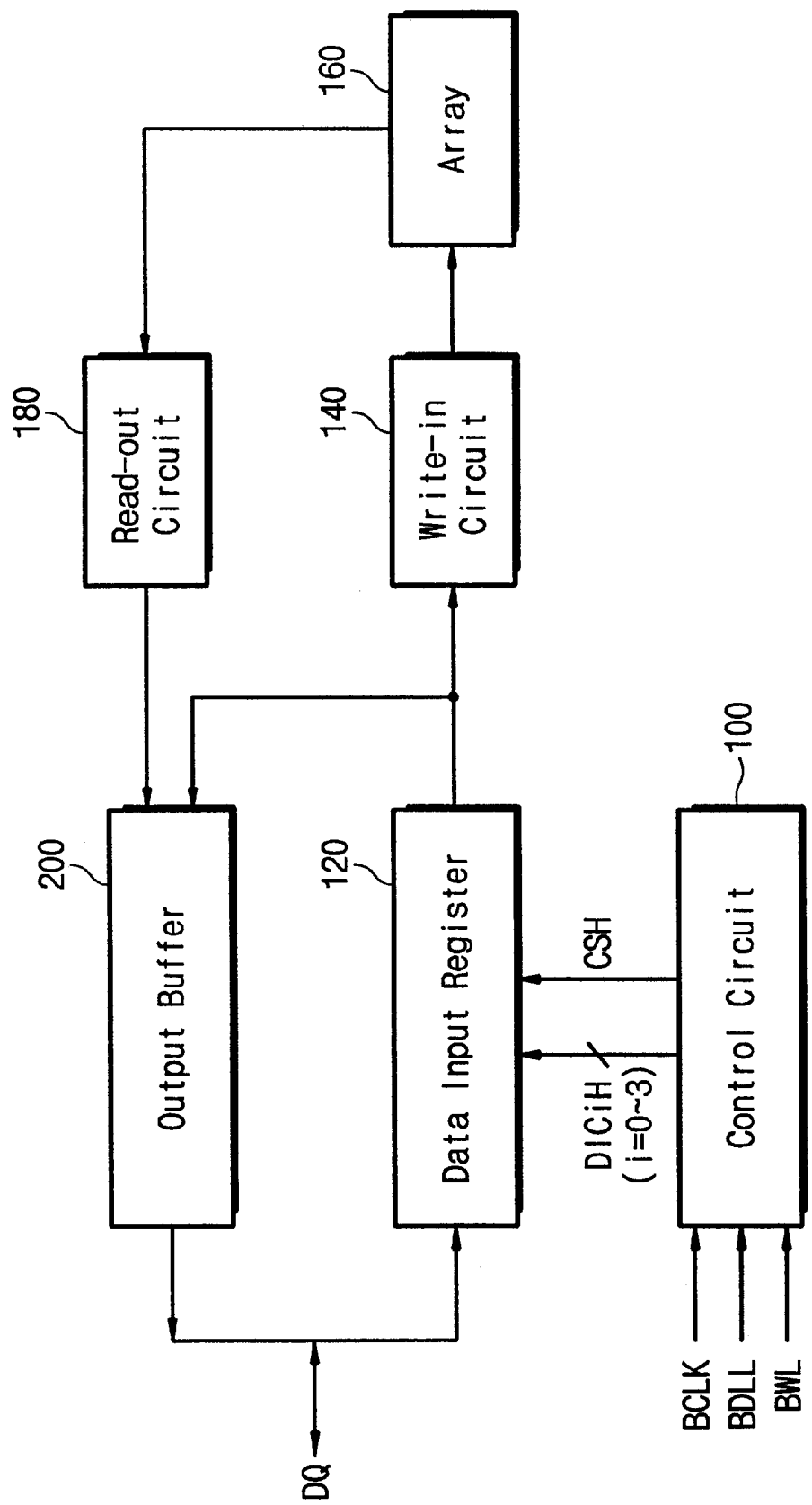
FIG. 1 is a block diagram illustrating the architecture of a synchronous SRAM (Static Random-Access Memory) device in accordance with the present invention.

FIG. 1 is a block diagram illustrating a synchronous SRAM device in accordance with the present invention. Referring to FIG. 1, the SRAM device of the present invention includes a data input register 120. The register 120 latches burst data under the control of a control circuit 100, and transmits the latched data to a write-in circuit 140. The write-in circuit 140 writes data from the data input register 120 into a memory cell array 160. A read-out circuit 180 reads data from the memory cell array 160, and the read data is output through an output buffer 200. In bypass read-out operation mode, the output buffer 200 outputs data latched in the data input register in accordance with control signals from an address comparator (as proposed in U.S. Pat. No. 6,134,180).

The data input register 120 latches sequentially burst data from external sources in response to data input control signals DICiH from the control signal 100. The latched data is output to the write-in circuit 140 in accordance with a flag signal CSH from the control circuit 100.

The control circuit 100 receives a clock signal BCLK and control signals BDLL and BWL, and generates the flag signal CSH and the data input control signals DICiH (i=0~3). The control signal BDLL causes the loading of an external address into SRAM device, and the control signal BWL causes a write-in operation. The flag signal CSH includes information related to the state of the write-in command at the next command input cycle following the input of a write-in command. For example, when the write-in command is successively input, a low-level flag signal CSH is generated. After inputting the write-in command, when other signals (e.g. read-out command or NOP command) are input, a high-level flag signal CSH is generated.

The data input control signals DICiH are continuously generated in synchronism with the clock signal BCLK whenever the write-in command is input. Each data input control signal is a pulse type, and is activated during a half cycle of the BCLK clock signal. The number of the data input control signals DICiH may vary in accordance with burst length of the SRAM device. For example, if it is assumed that the burst length of SRAM device is '4', four data input control signals DIC0H–DIC3H are sequentially generated in synchronism with the BCLK.

Figure 2:
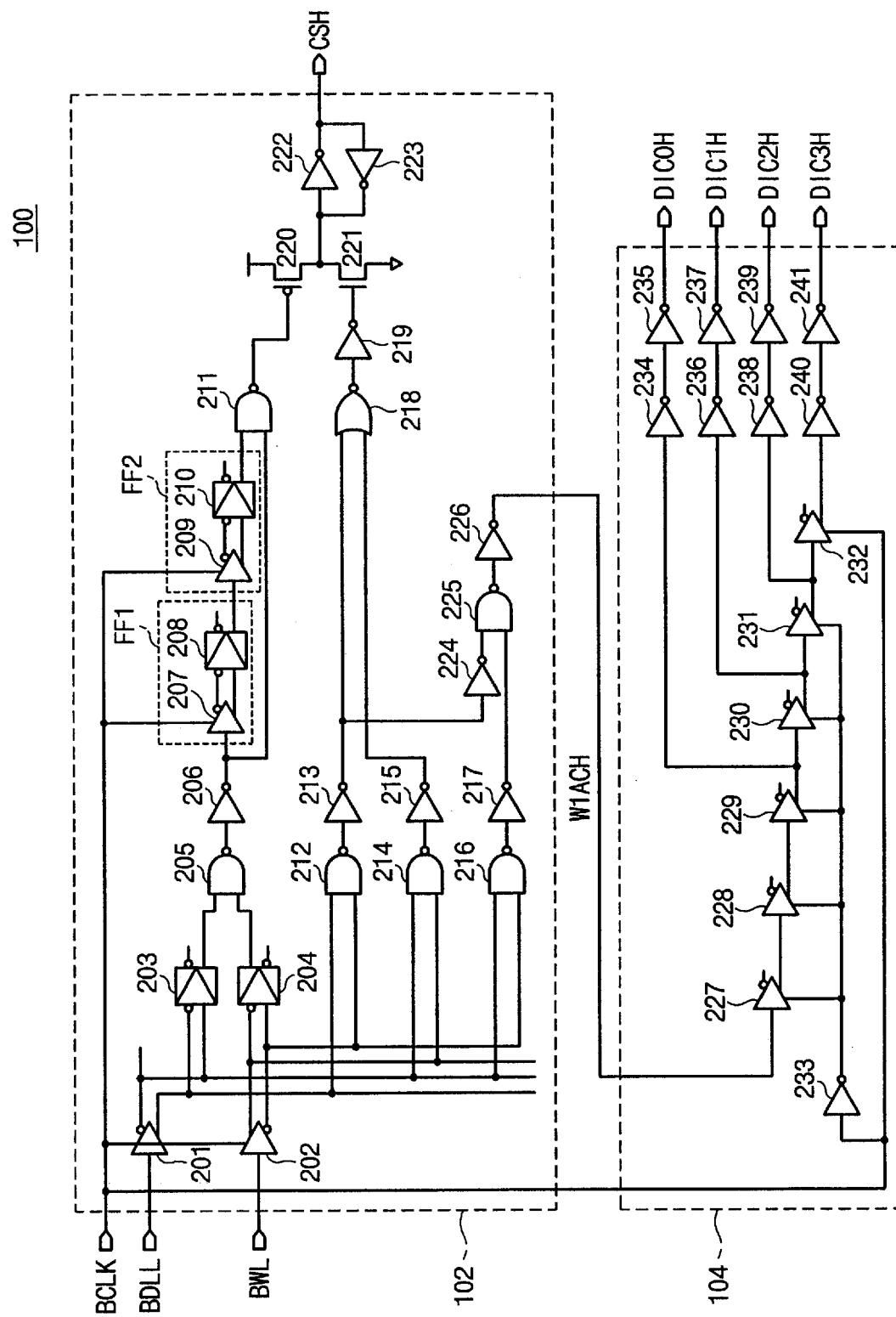
FIG. 2 is a circuit diagram illustrating a preferred embodiment of the control circuit shown in FIG. 1.

FIG. 2 is a circuit diagram showing a control circuit 100 in accordance with a preferred embodiment of the present invention. The control circuit 100 of the present invention is composed of a write-in command detector 102 and a data input control signal generator 104. The write-in command detector 102 detects the state of the write-in command, i.e. whether the write-in command is input or not in response to the clock signal BCLK and the control signals BDLL and BWL. If the write-in command is input, the write-in command detector 102 generates a high-leveled flag signal W1ACH informing a write-in operation (or informing that the currently input command is a write-in command). Further, if a write-in command is input again after the write-in command has just previously been input, the write-in command detector 102 generates a low-level flag signal CSH. The write-in command detector 102 is composed of first logic elements 201, 202, 207, and 209, second logic elements 203, 204, 208, and 210, NAND gates 205, 211, 212, 214, 216, and 225, NOR gate 218, inverters 206, 213, 215, 217, 219, 222–224, and 226, PMOS transistor 220, and NMOS transistor 221. The data input control signal generator 104 sequentially generates data input control signals DIC0H–DIC3H synchronized with the clock signal BCLK whenever the control signal W1ACH is activated to high level. The data input control signal generator 124 is composed of first logic elements 227–232 and inverters 233–241.

Figure 3A:
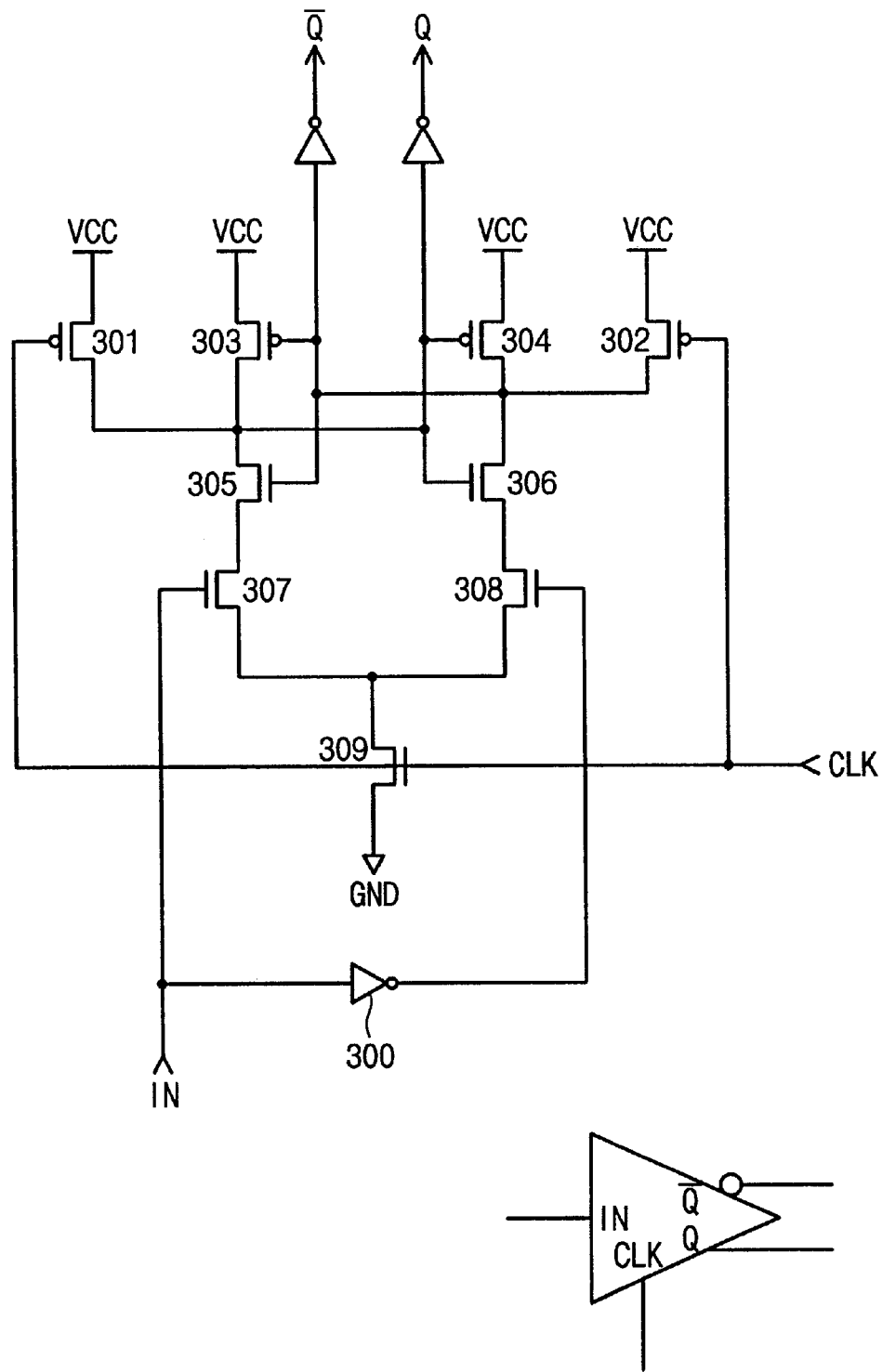
FIG. 3A is a circuit diagram illustrating a preferred embodiment of the first logic element shown in FIG. 2.
Figure 3B:
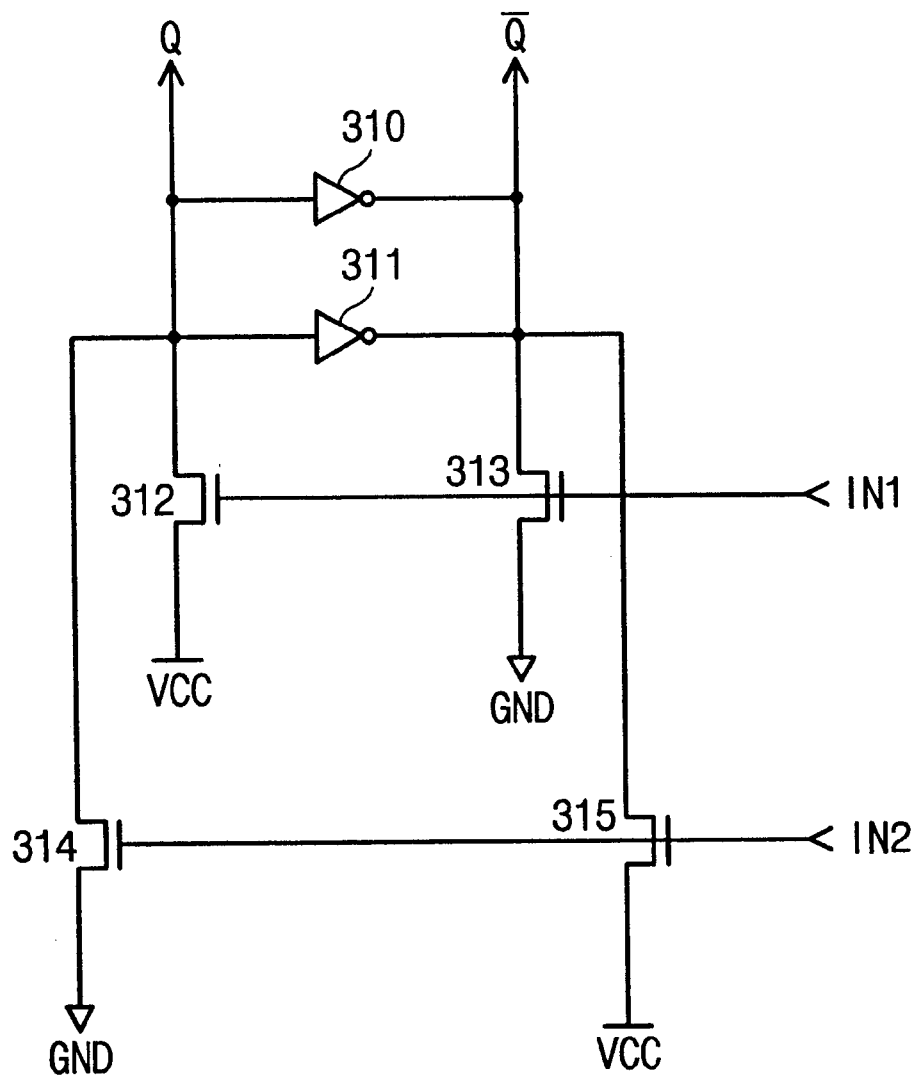
FIG. 3B is a circuit diagram illustrating a preferred embodiment of the second logic element shown in FIG. 2.
Figure 3B:
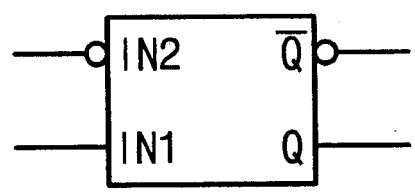

Referring to FIG. 3A, the first logic elements 227–232 each generate low-level output signals Q and $\overline{Q}$ regardless of an input signal IN when a clock signal CLK is at a low level, and generates complementary leveled output signals Q and $\overline{Q}$ in response to the input signal IN when the clock signal CLK is at a high level. That is, when the input signal IN is a low level, the output signals Q and $\overline{Q}$ are low and high level, respectively, and when the IN is high level, the Q and $\overline{Q}$ are high and low level, respectively. Referring to FIG. 3B, output signals Q and $\overline{Q}$ of the second logic elements 203, 204, 208, 210 become a previous state when input signals A and B are both at low levels. When the input signals IN1 and IN2 are low and high level, respectively, the output signal Q and $\overline{Q}$ of the second logic elements become low and high levels, respectively. When the IN1 and IN2 are high and low level, respectively, the Q and $\overline{Q}$ become high and low levels, respectively.

By connecting the Q and $\overline{Q}$ of the first logic element to inputs IN1 and IN2, respectively, the combination of the first logic element and the second logic element operates as an edge-triggered D flip-flop. Therefore, in the write-in command detector 102, two pairs of first and second logic elements act as edge-triggered D flip-flops.

Referring to FIGS. 2, 3A, and 3B, operation of the control circuit will now be explained. When the input signals BDLL and BWL are both at low levels and the clock signal BCLK is at a rising edge (This condition is regarded as write-in command in the SRAM device), output signals Q and $\overline{Q}$ of the first logic element 201 become low and high levels, respectively, and output signals Q and $\overline{Q}$ of the first logic element 202 are also at low and high levels, respectively. The output signal $\overline{Q}$ of the first logic element 201 is transmitted to one input terminal of the NAND gate 205 through the second logic element 203, the output signal $\overline{Q}$ of the first logic element 202 is transmitted to another input terminal of the NAND gate 205 through the second logic element 204.

An output signal of the NAND gate 205 is transmitted to one input terminal of a flip-flop FF1 and the NAND gate 211 through the inverter 206. The output signal of the NAND gate 205 is latched in the FF1 at up-edge of the clock signal BCLK. Since the output signal of the NAND gate 205 is at a low level, an output of the NAND gate 211 is determined by an output of a flip-flop FF2. If the output of the FF2 is at a low level (informing that the previously input command is not a write-in command), the output of the NAND gate 211 becomes a high level. If, on the other hand, the output of the FF2 is high level informing the previously inputted command to be the write-in command, the output of the NAND gate 211 becomes a low level. If the write-in command is not input, the output of the NAND gate 211 becomes a high level, and the PMOS transistor 220 connected to the NAND gate 211 is turned off.

An output of the NAND gate 212 connected to the output signals Q and $\overline{Q}$ of the first logic elements 201 and 202 becomes high level, and an output of the NAND gate 214 connected to the output signals Q and $\overline{Q}$ of the first logic elements 201 and 202 becomes also high level. Since NOR gate 218 generates a high-leveled signal, which receives the outputs of the NAND gates 212 and 214 through the inverters 213 and 215, the NMOS transistor 221 is turned off. Therefore, the flag signal CSH informing that the write-in command is successively input is maintained at a previous state by a latch composed of the inverters 222 and 223.

At the next clock cycle, when the clock signal transitions from a low to high level, a value latched in the FF1 (a high-level signal informing that the write-in command is previously input) is latched in the FF2.

In the case where the write-in command is input at the next cycle, since the output of the NAND gate 205 remains at a low level (as described above), two inputs of the NAND gate 211 (outputs of the FF2 and the inverter 206) are both at high levels. Therefore, the PMOS transistor 220 is turned on, and the flag signal CSH becomes low level. The low-leveled flag signal CSH means that the write-in command is successively input.

At the input of the next command following write-in command input, if the write-in command is not input (e.g. signal BDLH is 'H', and signal BWL is 'L'), the output signals Q and $\overline{Q}$ of the first logic element 201 become high and low, respectively, and the output signals Q and $\overline{Q}$ of the first logic element 202 become low and high, respectively. While the output signal $\overline{Q}$ of the first logic element 201 is transmitted to one input terminal of the NAND gate 205 through the second logic element 203, the output signal $\overline{Q}$ of the first logic element 202 is transmitted to another input terminal of the NAND gate 205 through the second logic element 204. The output signal of the NAND gate 205 is latched in the flip-flop FF1 through the inverter 206. That is, the FF1 latches a low-level signal. Since the output of the inverter 206 is low, the PMOS transistor 220 gated by the NAND gate 211 becomes inactivated.

At the same time, while the output of the NAND gate 212 connected to the output signals Q and $\overline{Q}$ of the first logic elements 201 and 202 becomes a low level, an output of the NAND gate 214 connected to the output signals Q and $\overline{Q}$ of the first logic element 201 and 202 becomes a high level. Since the NOR gate 218 receiving outputs of the NAND gates 212 and 214 through the inverters 213 and 215, the NMOS transistor 221 becomes turned on. Therefore, the flag signal CSH becomes a high-leveled signal informing that the write-in command is not input continuously.

In the case where the current input command is not a write-in command (e.g. signal BDLH is 'H', and signal BWL is 'L'), because outputs of the inverters 213 and 217 are high and low level, respectively, the write-in command detector 102 generates a low-leveled flag signal W1ACH. This means that the current inputted command is not a write-in command. Since the flag signal W1ACH is at a low level, data input control signals DIC0H–DIC3H are maintained at a low level.

If the current write-in command is input, because the outputs of the inverters 213 and 217 are low and high level, respectively, the flag signal W1ACH transitions from a low to high level. This means the current input command is a write-in command. The high-level flag signal W1ACH is sequentially shifted through six first logic elements. That is, when the clock signal BCLK transitions from low to high, first logic elements 227, 229, and 231 receive an output of the prior column. When the BCLK goes from high to low, first logic elements 228, 230, and 232 receive an output of the prior column. As a result, following the input of the write-in command and following 1½ cycles of the BCLK, the data input control signals DICiH are sequentially generated in synchronism with falling and rising edges of the clock signal BCLK, respectively. Each activation period of data input control signals DICiH corresponds to a half cycle of the clock signal.

In short, if the current inputted command is a write-in command, the write-in command detector 102 generates a high-leveled flag signal W1ACH, and the data input control signal generator 104 sequentially generates data input control signals DICiH to be synchronized with falling and rising edges of the clock signal BCLK, respectively, in response to the high-level flag signal W1ACH after the write-in command is input, and after 1½ cycles of the BCLK. If the currently input command is not a write-in command, the data input control signals DICiH are maintained at a low level. Further, if the write-in command is successively input, the write-in command detector 102 generates a low-leveled flag signal CSH by using previous and current write-in commands shifted by the flip-flops FF1 and FF2. That is, the write-in command detector 102 detects a successively input write-in command, and thereby a low-leveled flag signal CSH is generated.

Figure 4:
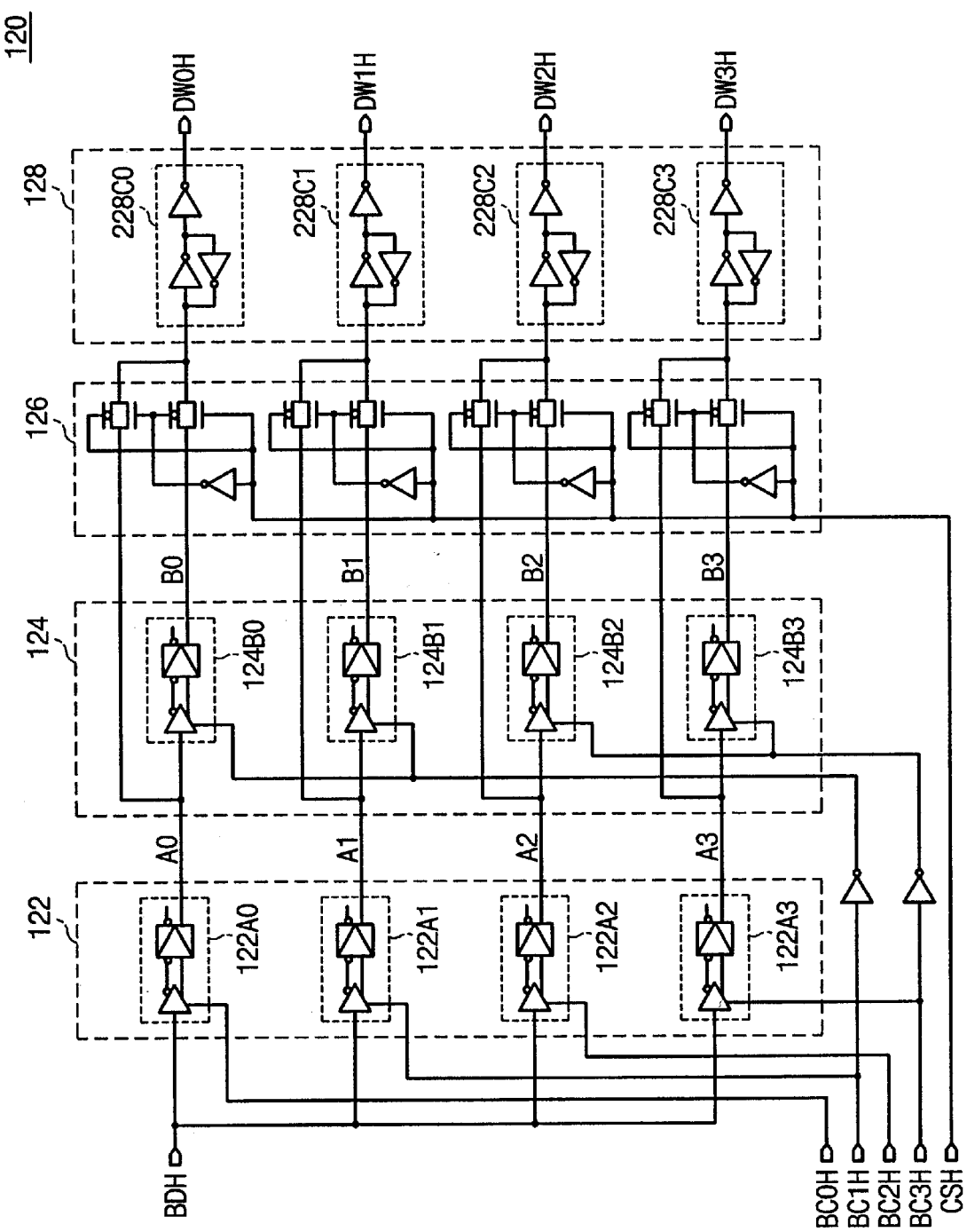
FIG. 4 is a circuit diagram illustrating a preferred embodiment of the data input register shown in FIG. 1.

FIG. 4 is a circuit diagram showing a preferred embodiment of the data input register in accordance with the present invention. The data input register 120 corresponds to one of the data input/output pins. It is apparent that data input registers corresponding to other data input/output pins are composed of the same architecture with the data input register 120. The data input register 120 includes first to third latch circuits 122, 124, and 128 and multiplexer 126.

The first latch circuit 122 is composed of edge-triggered D flip-flops (to be referred to as flip-flop hereinafter) 122A0, 122A1, 122A2, and 122A3 corresponding to burst length (e.g. 4). Each flip-flop 122A0, 122A1, 122A2, and 122A3 is composed of the first and second logic elements shown in FIGS. 3A and 3B. The flip-flops 122A0, 122A1, 122A2, and 122A3 sequentially latch the data input successively in response to the corresponding data input control signals DIC0H–DIC3H. The data input control signals DIC0H-DIC3H are sequentially activated in synchronism with the clock signal BCLK.

The second latch circuit 124 includes four flip-flops 124B0, 124B1, 124B2, and 124B3. Each of the flip-flops is composed of the first and second logic elements shown in FIGS. 3A and 3B. When the data input control signal DIC1H transitions form a high to a low level, the two flip-flops 124B0 and 124B1 latch outputs of the flip-flops 122A0 and 122A1 of the first latch circuit 122. The other two flip-flops 124B2 and 124B3, when the data input control signal DIC3H goes from high to low level, latch outputs of the flip-flops 122A2 and 122A3 of the first latch circuit 122. Here, the second latch circuit 124 is used as a temporary register for temporarily storing data to be transmitted to the output buffer at the bypass read-out operation mode.

The multiplexer 126 is composed of inverters and transmission gates. Responding to the flag signal CSH generated from the control circuit 100, the multiplexer 126 transmits outputs (i.e. burst data) of the latch circuit selected among the first latch circuit 122 and the second latch circuit 124 to the third latch circuit 128. The third latch circuit 128 is composed of four buffers 128C0, 128C1, 128C2, and 128C3, and generates an output by latching the burst data DW0H, DW1H, DW2H, and DW3H transmitted through the multiplexer 126.

Figure 5:
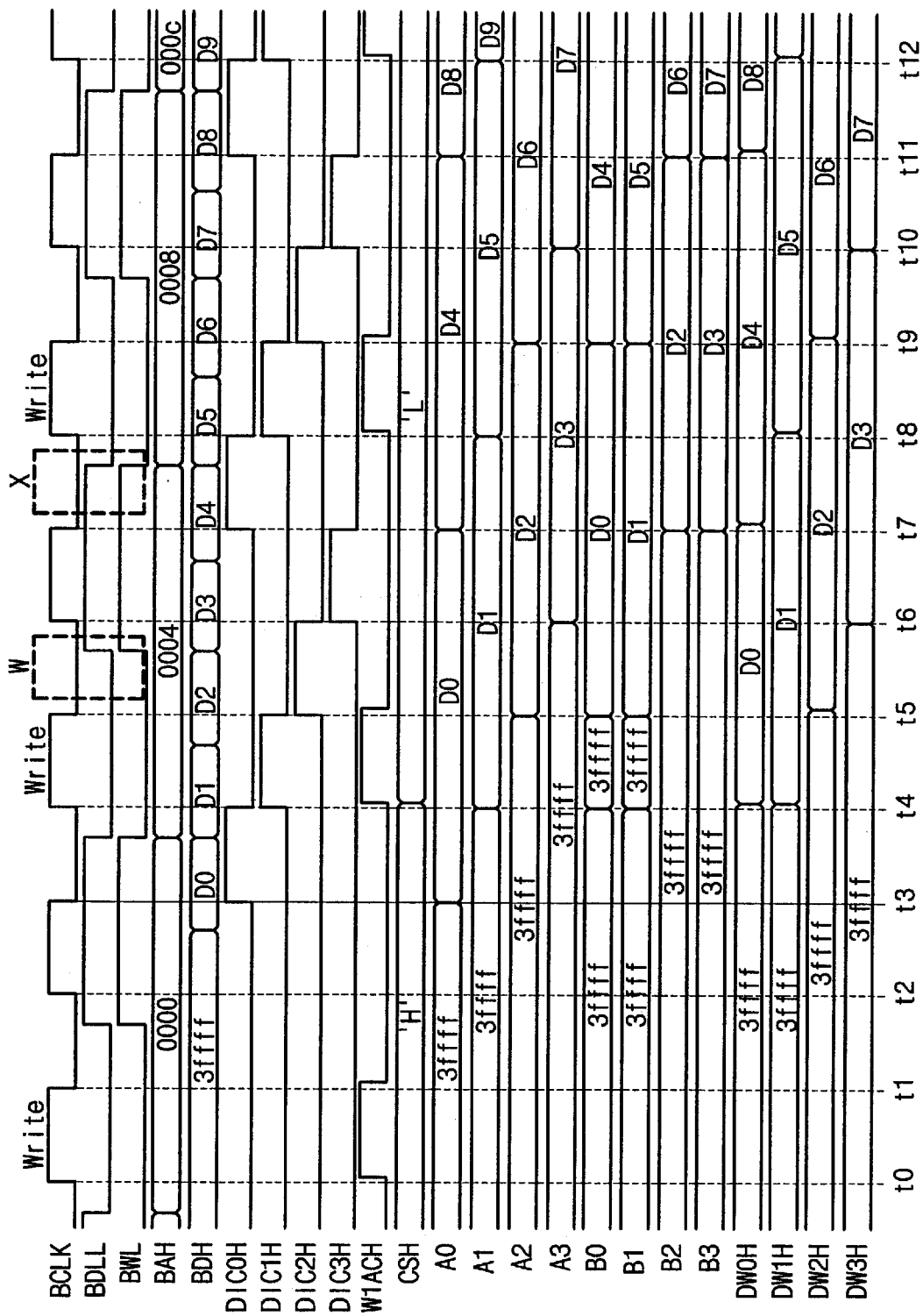
FIG. 5 is a timing diagram explaining operation of the SRAM device illustrating successive input of write-in commands.
Figure 6:
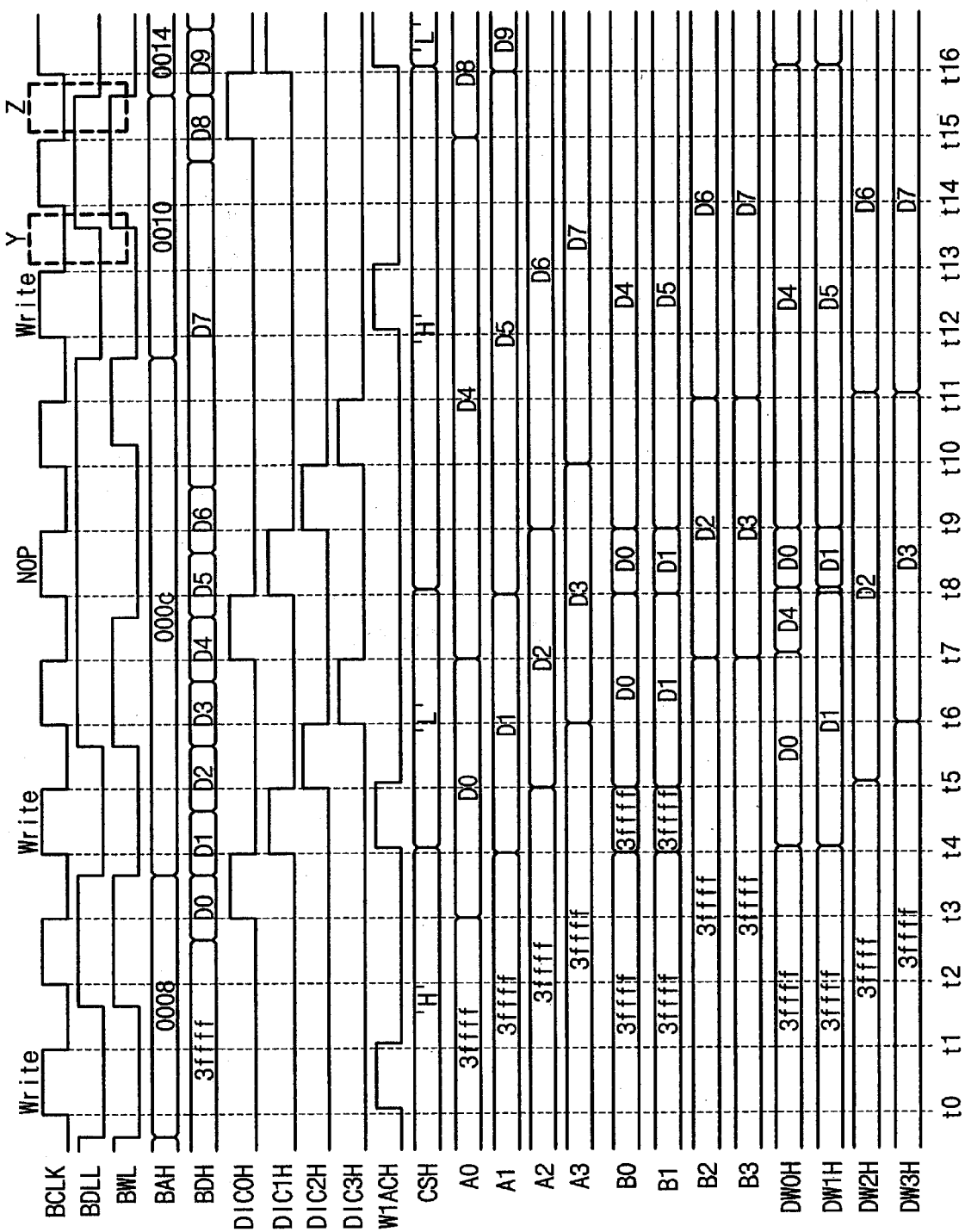
FIG. 6 is a timing diagram explaining operation of the SRAM device for the case where an NOP command is input after the write-in command.

FIGS. 5 and 6 are timing diagrams explaining the write-in operation of the SRAM device in accordance with the present invention. While the timing diagram of FIG. 5 corresponds a case that write-in command is input following a previous write-in command, the timing diagram of FIG. 6 corresponds a case that NOP command is inputted following a write-in command. In advance of explaining the write-in operation, it is noteworthy that the SRAM device of the present invention has enough setup time (or timing margin) required for writing data into a memory cell when data is written by late write type configuration in the DDR mode, even though data is input after 1½ clock cycles when the write-in command is input. When the write-in command is input, the control circuit 100 and the data input register 120 allow for the data to be input after 1½ clock cycles.

Referring to FIG. 5, at the moment of low-to-high transition of the clock signal BCLK, since the control signals BDLH and BWH are at low levels, the write-in command detector 102 of the control circuit 100 generates a flag signal W1ACH transitioning from low to high. The data input control signal generator 104 of FIG. 2, following 1½ clock cycles on a basis of the input moment t0 of the write-in command, sequentially generates the data input control signals DICiH (i=0~3) synchronized with falling and rising edges of the clock signal BCLK in response to the flag signal W1ACH transitioning from low to high.

In accordance with the generated data input control signals DICiH, burst data D0–D3 are latches in flip-flops 122A0–122A3 of the first latch circuit 122 in the data input register 120, respectively. Among the latched burst data D0–D3, data D0 and D1 latched in the flip-flops 122A0 and 122A1 are transmitted to the flip-flops 124B0 and 124B1 of the second latch circuit 124 in accordance with low-to-high transition of the data input control signal DIC1H. Similarly, data D2 and D3 latched in the other flip-flops 122A2 and 122A3 are transmitted to the flip-flops 124B2 and 124B3 in accordance with high-to-low transition of the data input control signal DIC3H.

At moment t2, when the clock signal BCLK transitions from a low to a high level, a value (i.e. high-leveled signal) latched in the flip-flop FF1 of the write-in command detector 102 shown in FIG. 2 is latched in the flip-flop FF2.

As shown in FIG. 5, at moment t4, the write-in command is input again, and thereby both input signals of the NAND gate 211 shown in FIG. 2 become high level. Therefore, the write-in command detector 102 of the control circuit 100 generates the low-leveled flag signal CSH. This causes burst data latched in the first latch circuit 122 to be directly transmitted as the write-in data DWiH (i=0~3) to the write-in circuit 140 (FIG. 1) through the multiplexer 126 and the third latch circuit 128.

Data transmitted to the write-in circuit 140 is substantially written into corresponding memory cells during a low state of the clock signal BCLK corresponding to the moment t4 at which the next write-in command is input and the BCLK corresponding the next cycle is low. Therefore, data D0 and D1 are written into the memory cell during an interval marked in W, and data D2 and D3 are written into the memory cell during an interval marked in X. In order to perform the write-in operation, enough setup time can be obtained for data DWiH (i=b 0~3) generated from the data input register 120.

Referring to FIG. 6, in case that NOP command is applied after write-in command is applied twice successively, the operation of the control circuit 100 and data input register 120 corresponding to the first write-in command is the same as that of FIG. 5. Since the NOP command is applied at moment t8, the flag signal CSH generated from the control circuit transitions from a low to a high level. Therefore, data D4 and D5 latched in the first latch circuit 102 are latched in the second latch circuit 104 at a high-to-low transition moment t9 of the data input control signal DIC1H, and data D6 and D7 latched in the first latch circuit 102 are latched in the second latch circuit 104 at a high-to-low transition moment t11 of the data input control signal DIC3H. The latched data D4 and D5 are written into corresponding memory cells by the write-in circuit 140 during a period of a low clock signal corresponding to moment t12 when the next write-in command is applied. Similarly, the latched data D6 and D7 are written into corresponding memory cells by the write-in circuit 140 during a period of low clock signal corresponding to moment t14. As shown in FIG. 6, enough setup time can be obtained for data DWiH (i=0~3) generated from the data input register 120.

As described above, enough time can be obtained to set up input data even though data is inputted to SRAM device after write-in command is input during a previous cycle.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A synchronous memory device having a late-write mode of operation comprising:

a write-in command detector for generating a first flag signal indicating receipt of a write-in command when the write-in command is applied to said memory device, for detecting whether said write-in command is received during successive clock cycles, and for generating a second flag signal indicating the receipt of successive write-in commands during successive clock cycles; and a data input control signal generator for sequentially generating multiple data input control signals synchronized with the clock cycles in response to said first flag signal, the data input control signals being generated following the receipt of said write-in command and thereafter following 1½ clock cycles.

2. The synchronous memory device of claim 1, wherein said data input control signals are sequentially activated during one-half cycle of said clock cycle.

3. The synchronous memory device of claim 2, wherein said first latch circuit includes first, second, third and fourth flip-flops which are separately controlled by said data input control signals.

4. The synchronous memory device of claim 3, wherein said second latch circuit includes fifth, sixth, seventh and eighth flip-flops, where said fifth and sixth flip-flops latch outputs of the first and second flip-flops in response to a second data input control signal, respectively, and wherein the seventh and eighth flip-flops latch outputs of the third and fourth flip-flops in response to a fourth data input control signal.

5. The synchronous memory device of claim 1 further comprising:
   a first latch circuit for sequentially latching write-in data from external sources in response to said data input control signals;
   a second latch circuit for latching data latched in said first latch circuit in response to at least one of the data input control signals; and
   a select circuit for selecting one of said first and second latch circuits in response to said second flag signal.

6. The synchronous memory device of claim 5, wherein said select circuit selects the first latch circuit when the second flag signal indicates that said write-in command is successively received, and wherein the select circuit selects the second latch circuit when the second flag signal indicates that another command is received following a write-in command.

* * * * *